United States Patent
Yamashita

(10) Patent No.: US 8,690,278 B2
(45) Date of Patent: Apr. 8, 2014

(54) WIRING SUBSTRATE UNIT AND PRINTER INCLUDING THE SAME

(75) Inventor: Toru Yamashita, Nagoya (JP)

(73) Assignee: Brother Kogyo Kabushiki Kaisha, Aichi, ken (JP)

( * ) Notice: Subject to any disclaimer, the term of this patent is extended or adjusted under 35 U.S.C. 154(b) by 270 days.

(21) Appl. No.: 13/048,472

(22) Filed: Mar. 15, 2011

(65) Prior Publication Data

US 2011/0242163 A1 Oct. 6, 2011

(30) Foreign Application Priority Data

Mar. 31, 2010 (JP) ................. 2010-082158

(51) Int. Cl.
*B41J 29/38* (2006.01)
*B41J 2/145* (2006.01)

(52) U.S. Cl.
USPC ............................... 347/9; 347/40

(58) Field of Classification Search
USPC ...................................... 347/9, 40
See application file for complete search history.

(56) References Cited

U.S. PATENT DOCUMENTS

2008/0316255 A1  12/2008  Kubo et al.

FOREIGN PATENT DOCUMENTS

| CN | 101504936 | 8/2009 |
|----|-----------|--------|
| JP | S58-194393 | 11/1983 |
| JP | 2009-004419 | 1/2009 |
| JP | 2009-188351 | 8/2009 |
| JP | 2009188351 A * | 8/2009 |

OTHER PUBLICATIONS

Notice of Reasons for Rejection of Japanese Patent Application No. 2010-082158 dated Jul. 10, 2012.
Notification of First Office Action of Chinese Patent Application No. 201110070376.6 dated Mar. 4, 2013.

* cited by examiner

*Primary Examiner* — Jason Uhlenhake
(74) *Attorney, Agent, or Firm* — Frommer Lawrence & Haug LLP

(57) ABSTRACT

A wiring substrate unit is provided. The unit includes: first and second wiring substrates, first and second input portions respectively formed in marginal portions of the first and second wiring substrates, and first and second output contact points respectively formed on one surfaces of the first and second wiring substrates. A through hole is formed in the first wiring substrate to correspond to the second output contact point; a cutout is formed either at a position adjacent to the first input portion of the marginal portion of the first wiring substrate or at a position adjacent to the second input portion of the marginal portion of the second wiring substrate; and one of the first and second input portions is exposed from the cutout.

13 Claims, 10 Drawing Sheets

SCANNING DIRECTION

PAPER FEEDING DIRECTION

PAPER FEEDING DIRECTION

SCANNING DIRECTION

PAPER FEEDING DIRECTION

SCANNING DIRECTION

WIRING SUBSTRATE UNIT AND PRINTER INCLUDING THE SAME

CROSS REFERENCE TO RELATED APPLICATION

The present application claims priority from Japanese Patent Application No. 2010-082158, filed on Mar. 31, 2010, the disclosure of which is incorporated herein by reference in its entirety.

BACKGROUND OF THE INVENTION

1. Field of the Invention

The present invention relates to a wiring substrate unit for supplying signals to a drive target (drive object) and to a printer including the wiring substrate unit.

2. Description of the Related Art

Conventionally, the wiring units connected to various apparatuses to supply signals thereto are known. For example, in the field of recording apparatuses provided with a great number of recording elements for recording images, characters, and the like on an object recording medium such as a recording paper, it is desired to increase the number of the recording elements and arrange them in high density in order to meet the requirements of high-speed printing and high-resolution printing, in recent years. As a result, the contact points of the wiring substrate which are connected to the contact points of the recording elements are also increased along with the increased recording elements. Therefore, the contact points of the wiring substrate arranged in high density. Thereby, it becomes complicated to draw wires from the input portion to the plurality of contact points of the wiring substrate.

Here, as a configuration for making it easy to draw the wires, the wiring body to be connected to the piezoelectric actuator of an ink-jet head is known. In this wiring body, two of wiring substrates are stacked; and a plurality of substrate-side contact points corresponding to a plurality of element-side contact points of the piezoelectric actuator, input portions, and wires connected to the substrate-side contact points from the input portions are arranged so as to be divided in the two wiring substrates. Then, a through hole is formed in one of the wiring substrates facing the piezoelectric actuator at the position facing the substrate-side contact points formed on the other wiring substrate, and the substrate-side contact points formed on the other wiring substrate are exposed from the through hole to the piezoelectric actuator side. In this manner, the plurality of substrate-side contact points and the input portions are arranged separately on the two wiring substrates to make it easy to draw the wires from the input portions to the substrate-side contact points.

However, in the known wiring body, the two input portions arranged respectively on the two wiring substrates are shifted or separated in the stacked direction of the two wiring substrates. Therefore, two signal supply portions to be connected to the two input portions have to be separated in the stacked direction. Therefore, it is necessary to connect the signal supply portions to the two input portions, respectively.

SUMMARY OF THE INVENTION

Accordingly, an object of the present invention is to provide a wiring substrate unit which is configured to draw the wires from the input portion to the output contact points easily, which is configured to simplify the structure of the input portion, and which is configured to be expeditiously connected to the signal supply portion, and a printer provided with the wiring substrate unit.

According to a first aspect of the present invention, there is provided a wiring substrate unit which is connected to a signal supply portion and through which a signal is transmitted to a drive object, including:

a first wiring substrate through which the signal is transmitted to the drive object;

a second wiring substrate which is stacked on the first wiring substrate and through which the signal is transmitted to the drive object;

a first input portion which includes a plurality of first input terminals formed in an end portion of the first wiring substrate and which is connected to the signal supply portion;

a second input portion which includes a plurality of second input terminals formed in an end portion of the second wiring substrate and which is connected to the signal supply portion;

a plurality of first output contact points which is formed on one surface of the first wiring substrate and which is electrically connected to the first input portion; and a plurality of second output contact points which is formed on one surface of the second wiring substrate and which is electrically connected to the second input portion, wherein the first wiring substrate and the second wiring substrate are stacked so that the other surface of the first wiring substrate face the one surface of the second wiring substrate, a through hole, which is configured to electrically conduct the second wiring substrate and the drive object, is formed in the first wiring substrate to correspond to the second output contact points formed on the second wiring substrate, a cutout is formed at a position adjacent to the first input portion of the end portion of the first wiring substrate or at a position adjacent to the second input portion of the end portion of the second wiring substrate, and one of the first input portion of the first wiring substrate and the second input portion of the second wiring substrate is exposed from the cutout.

According to the wiring substrate unit in accordance with the present invention, it is possible to draw the wire connected to the first output contact point from the first input portion and the wire connected to the second output contact point from the second input portion separately on the first wiring substrate and the second wiring substrate. Therefore, the number of wires per substrate can be decreased, and thereby it is possible to make it easy to draw the wire from the input portion to the output contact point.

Further, the first input portion or the second input portion on one of the first wiring substrate and the second wiring substrate is exposed from the cutout formed in the other of the first wiring substrate and the second wiring substrate. Therefore, it is possible to arrange one input portion and the other input portion on almost the same plane. Further, when the one input portion and the other input portion are aligned in an array, for example, it is possible to regard the two input portions as a single member and connect the two input portions to one signal supply portion. Therefore, it is possible to simplify the structure of the input portions, and thereby it is possible to expeditiously connect each of the input portions to the signal supply portion. In addition, with respect to the present invention, the alignment of the first input portion and the second input portion includes of course the alignment of the first input portion and the second input portion without interval, and the alignment of the first input portion and the second input portion at an interval.

According to a second aspect of the present invention, there is provided a printer which discharges an ink to a medium to form an image, comprising:

a transport mechanism which transports the medium;

a head which discharges the ink to the medium transported by the transport mechanism; and a control section which controls the head, wherein the head has a channel unit in which a nozzle and a channel are formed, an actuator which applies a discharge pressure to the ink in the channel unit, and the wiring substrate unit, in accordance with the first aspect of the present invention, which electrically connects the actuator and the control portion.

DESCRIPTION OF THE PREFERRED EMBODIMENT

Hereinbelow, explanations will be made with respect to a preferred embodiment of the present teaching The embodiment is an example of applying the present teaching to an ink-jet printer which has an ink-jet head for jetting ink to a recording paper.

Figure 1:
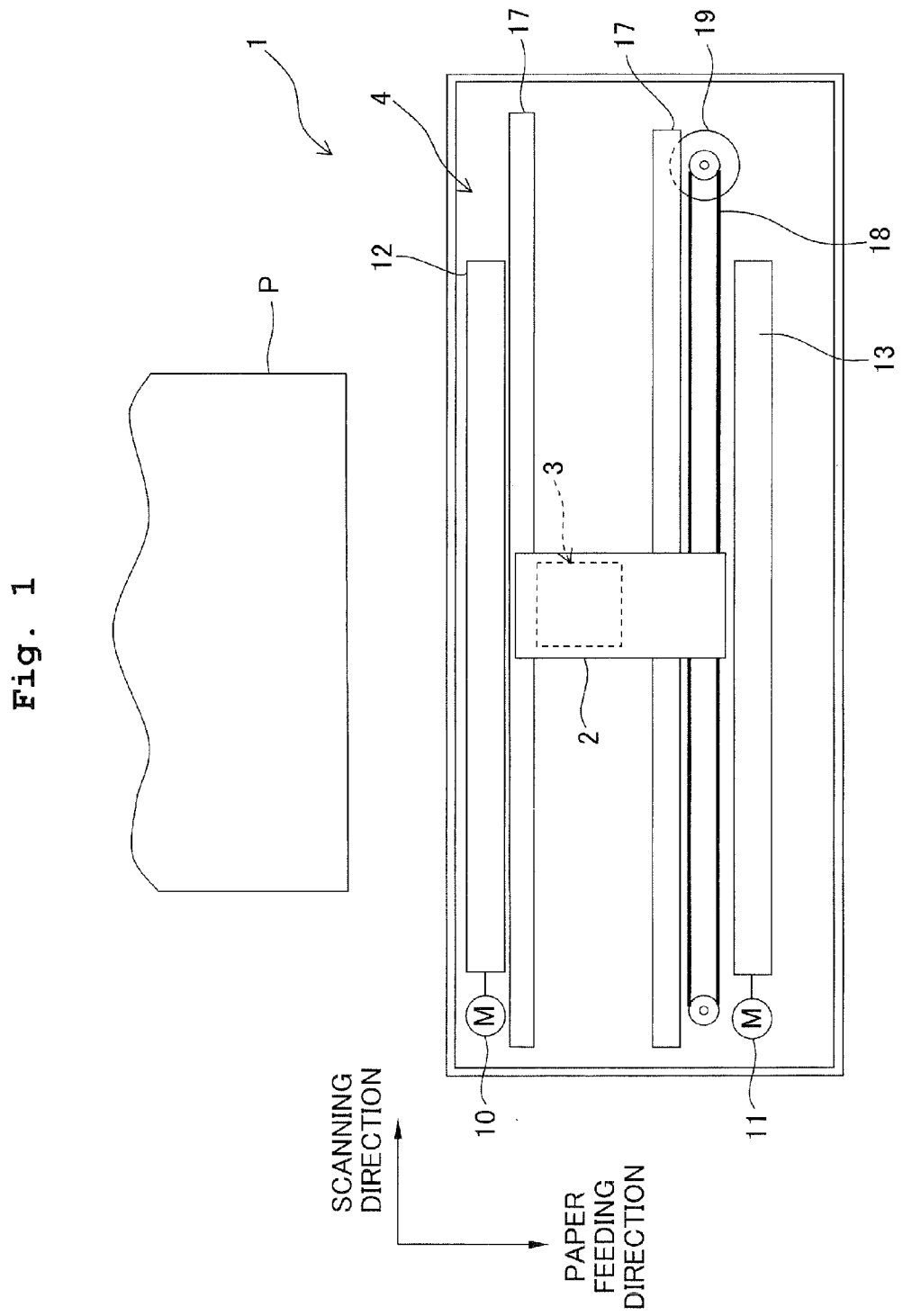
FIG. 1 is a schematic plan view of a printer in relation to an embodiment of the present invention.

First, explanations will be made with respect to a schematic configuration of the printer of the embodiment. As shown in FIG. 1, a printer 1 mainly includes a carriage 2 constructed to be movable in a reciprocating manner along a predetermined scanning direction (a left-right direction of FIG. 1), an ink-jet head 3 provided on the carriage 2, a transport mechanism 4 for transporting a recording paper P in a paper feeding direction perpendicular to the scanning direction, a control section 5 for controlling the ink-jet head 3, the transport mechanism 4 and the like.

The carriage 2 is configured to be movable in a reciprocating manner along two guide shafts 17 extending parallel to the scanning direction (the left-right direction of FIG. 1). Further, an endless belt 18 is connected to the carriage 2 so that the carriage 2 moves in the scanning direction along with the movement of the endless belt 18 when the endless belt 18 is driven by a carriage drive motor 19.

The ink-jet head 3 is provided on the carriage 2. A plurality of nozzles 35 (see FIG. 4) are formed in the lower surface of the ink-jet head 3 (the surface located on the back side of the plane of the paper in FIG. 1). The ink-jet head 3 is constructed so that the ink supplied by ink cartridges (not shown) is jetted from the plurality of nozzles 35 to the recording paper P transported by the transport mechanism 4 in a downward direction of FIG. 1 (the paper feeding direction).

The transport mechanism 4 has a paper feeding roller 12 which is arranged on the upstream side of the ink-jet head 3 in the transport direction, and a paper discharging roller 13 which is arranged on the downstream side of the ink-jet head 3 in the transport direction. The paper feeding roller 12 and the paper discharging roller 13 are driven by a paper feeding motor 10 and a paper discharging motor 11, respectively. Further, the transport mechanism 4 transports the recording paper P from the upper side of FIG. 1 toward the ink-jet head 3 by means of the paper feeding roller 12 and, at the same time, discharges the recording paper P on which images, characters and the like are recorded by the ink-jet head 3 to the under side of FIG. 1 by means of the discharging roller 13.

Figure 2:
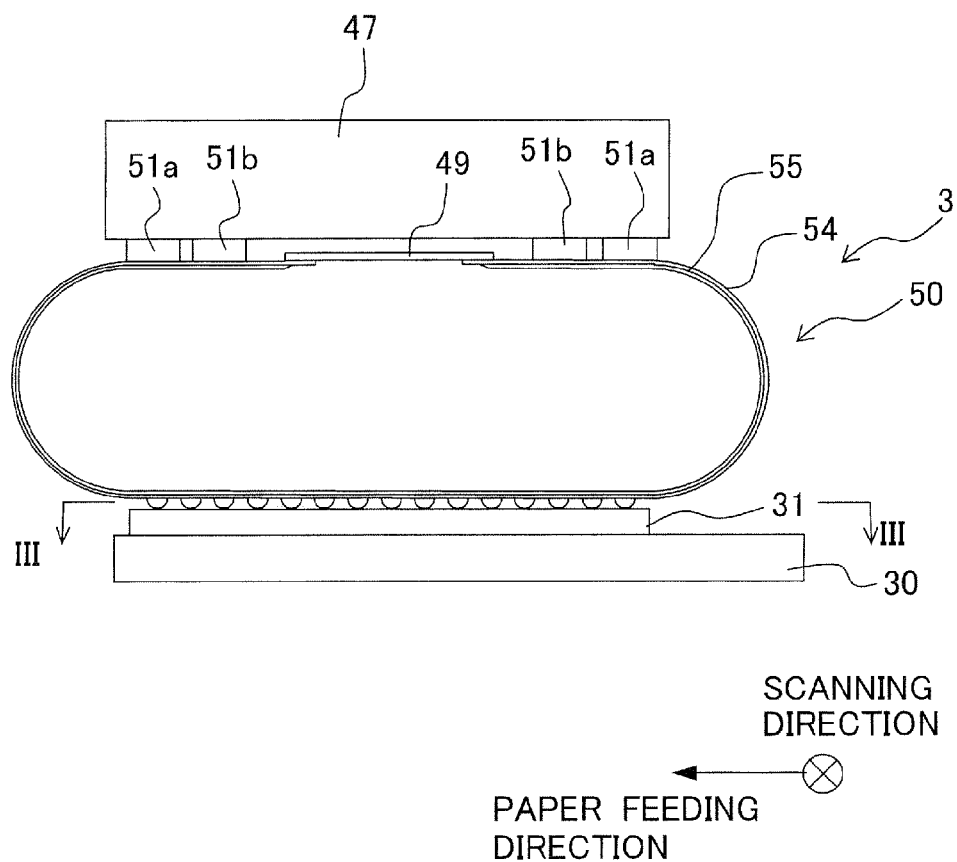
FIG. 2 is a lateral view of an ink-jet head.
Figure 3:
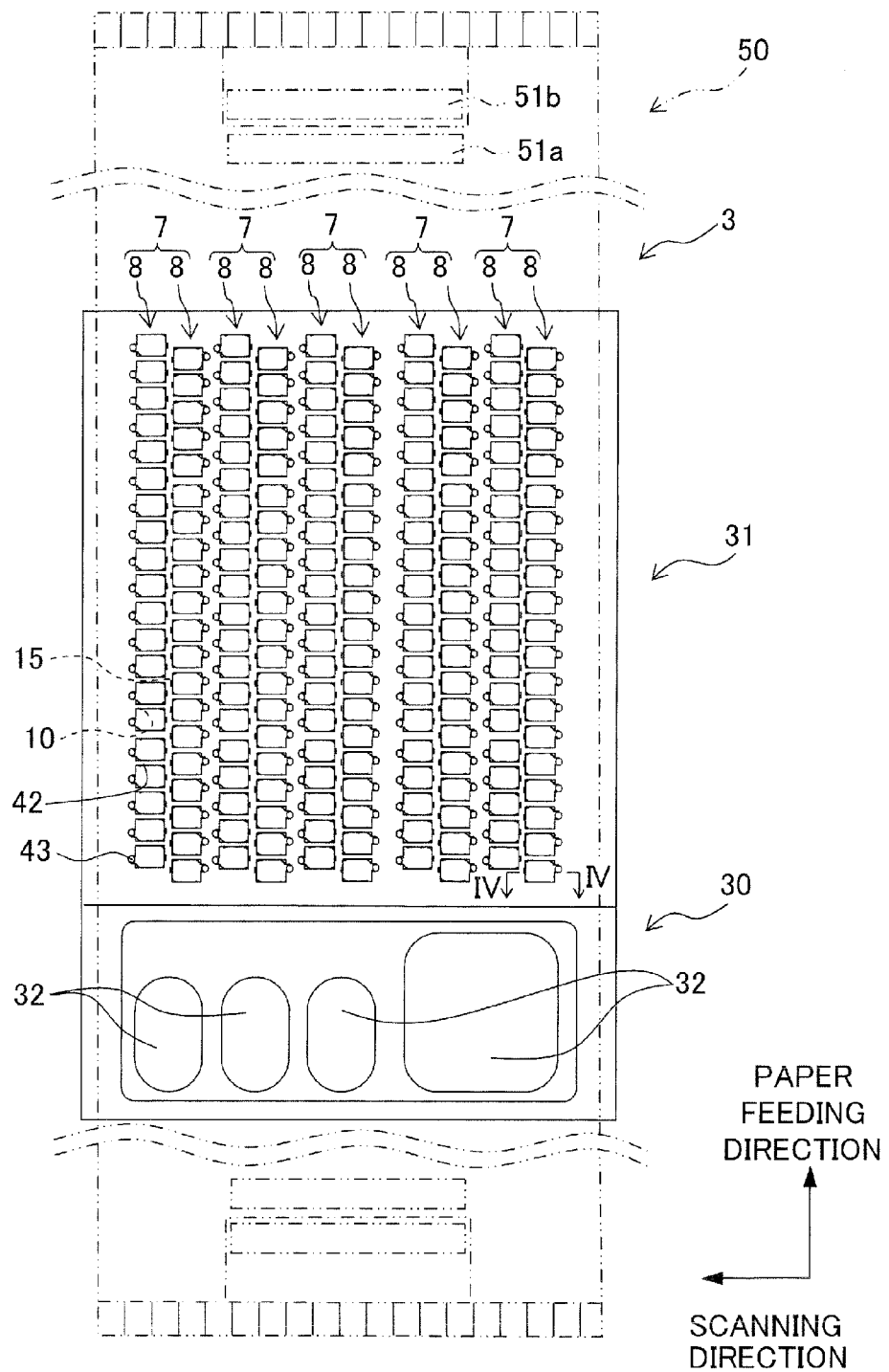
FIG. 3 is a fragmentary view taken along the arrow of FIG. 2.
Figure 4:
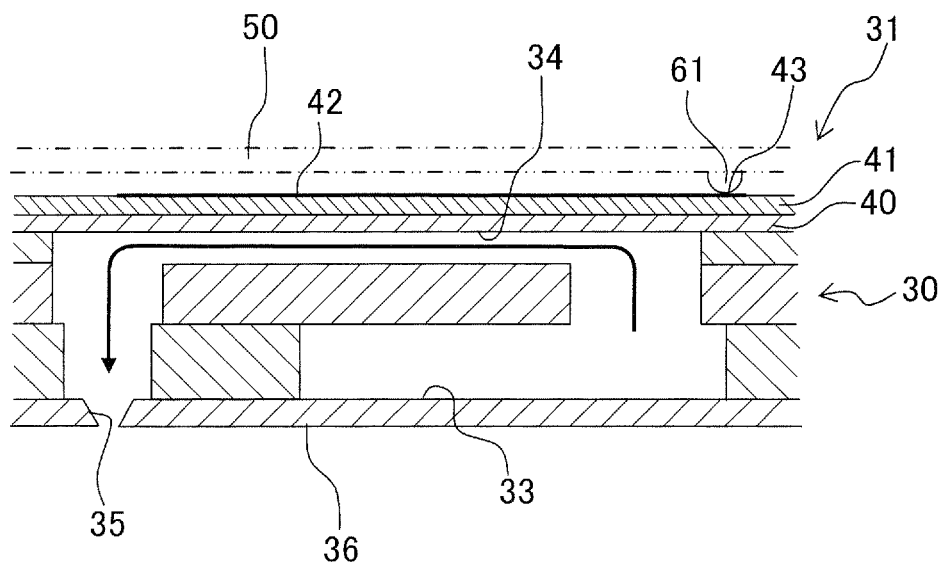
FIG. 4 is a cross-sectional view taken along the line IV-IV of FIG. 3.

Next, explanations will be made with respect to the ink-jet head 3 with reference to FIGS. 2 to 4. In a plan view of the ink-jet head 3, as shown in FIG. 3, an FPC unit 50 arranged on the upper side of an actuator unit 31 is shown with a dashed-two dotted line. As shown in FIGS. 2 to 4, the ink-jet head 3 has a channel unit 30 in which ink channels are formed, the piezoelectric actuator unit 31 (drive object) which applies a jetting pressure to the ink inside the ink channels, and the flexible wiring substrate unit 50 (FPC unit) which covers the upper surface of the actuator unit 31. The actuator unit 31 of the ink-jet head 3 is electrically connected to the control section 5 via the FPC unit 50, and an FFC 49 which will be described hereinafter.

In the channel unit 30, there are formed four ink supply ports 32 connected respectively to four ink cartridges (not shown), a manifold 33 connected to the ink supply ports 32 and extending along the up-down direction in FIG. 3 (the paper feeding direction) perpendicular to the scanning direction, a plurality of pressure chambers 34 each of which is connected to the manifold 33, and the nozzles 35 which are connected to the pressure chambers 34. The plurality of pressure chambers 34 are aligned along the manifold 33 extending in the paper feeding direction to form ten pressure chamber arrays 8. Further, a pressure chamber group 7 is formed by two pressure chamber arrays 8 adjacent with respect to the scanning direction and, in the channel unit 30, totally five pressure chamber groups 7 are provided to align in the scanning direction. Further, two pressure chamber groups 7, of the five pressure chamber groups 7, positioned on the right side in. FIG. 3 are the pressure chamber groups for the black ink to which the black-color ink is supplied from the large ink supply port 32. Further, the three pressure chamber groups 7 positioned on the left side in FIG. 3 are the pressure chamber groups for the other colors to which the three-color inks (yellow, magenta, and cyan) are supplied respectively from the other three ink supply ports 32.

The plurality of nozzles 35 which communicate with the pressure chambers 34 are formed to penetrate through the lower surface of the channel unit 30. Further, these plurality of nozzles 35 are arranged in arrays in the same manner as the pressure chambers 34. On the right side of FIG. 3, two nozzle groups are arranged to correspond to the two pressure chamber groups 7 for black ink, while on the left side of FIG. 3 three nozzle groups are arranged to correspond to the three pressure chamber groups 7 for the three-color inks.

The actuator unit 31 has a vibration plate 40 which is joined onto the channel unit 30 to cover the pressure chambers 34, a piezoelectric layer 41 which is arranged on the upper surface of the vibration plate 40, a plurality of individual electrodes 42 which are provided on the upper surface of the piezoelectric layer 41 to correspond to the pressure chambers 34, and a plurality of input contact points 43a and 43b which are formed at the end portions of the individual electrodes 42. Further, the actuator unit 31 deforms the vibration plate by using a piezoelectric strain which occurs in the piezoelectric layer 41 when a predetermined drive signal is supplied to an individual electrode 42 from a driver IC 51 of the FPC unit 50 which will be described hereinafter. When the flexural deformation occurs in the vibration plate 40, the volume of the pressure chamber 34 is subject to change. At the time, a pressure is applied to the ink inside the pressure chamber 34, and thereby ink is jetted from the nozzle 35 in communication with the pressure chamber 34. The plurality of input contact points 43 (43a and 43b) are arranged to align in lines at a predetermined interval in the paper feeding direction to correspond to the plurality of nozzles 35 and, at the same time, arranged to align in arrays in the scanning direction. Further, as will be described hereinafter, the input contact points 43a are those belonging to the odd-numbered arrays from the left of FIG. 3, while the input contact points 43b are those belonging to the even-numbered arrays from the left of FIG. 3.

Figure 5:
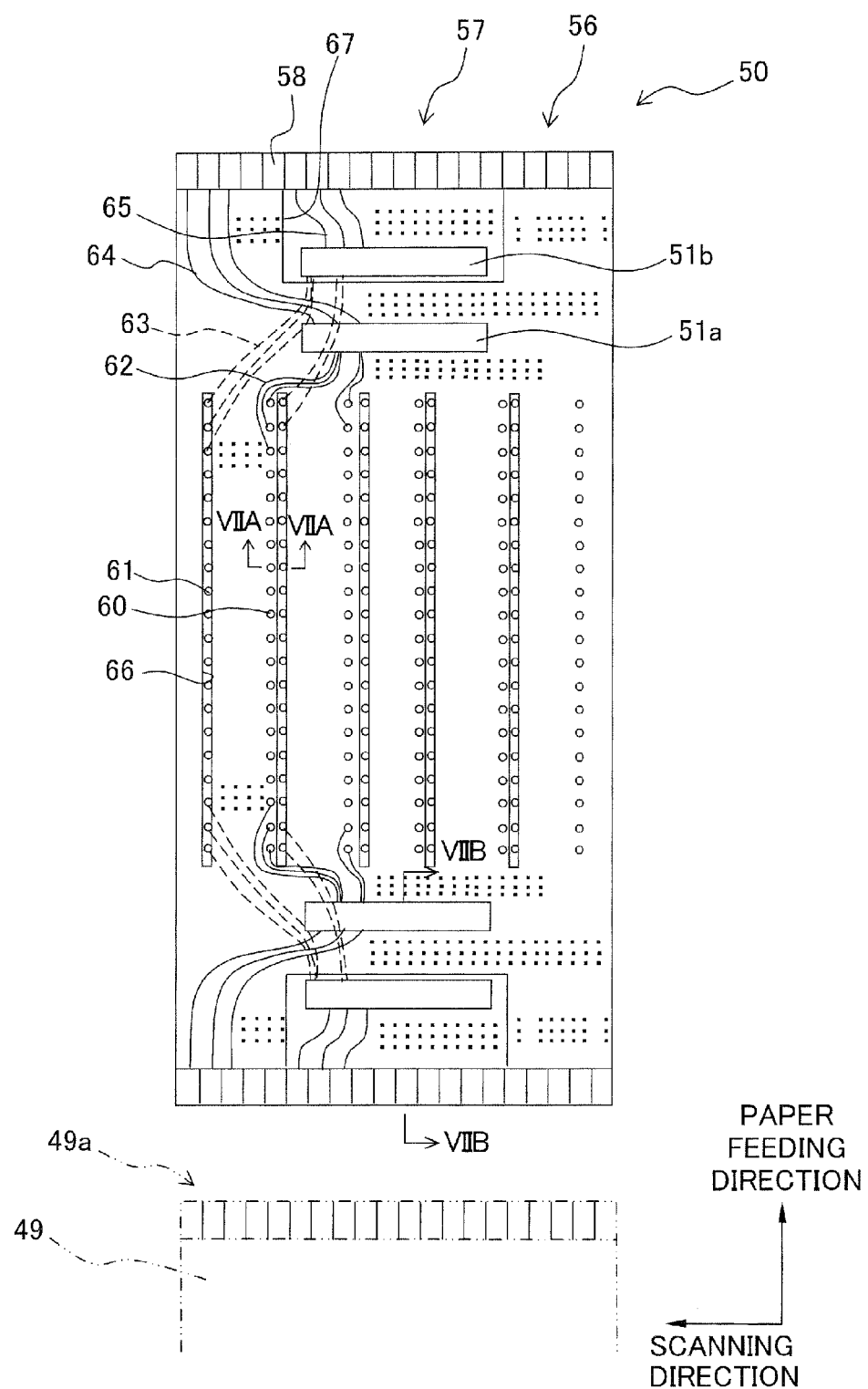
FIG. 5 is a plan view observing an FPC unit from the under side.
Figure 6A:
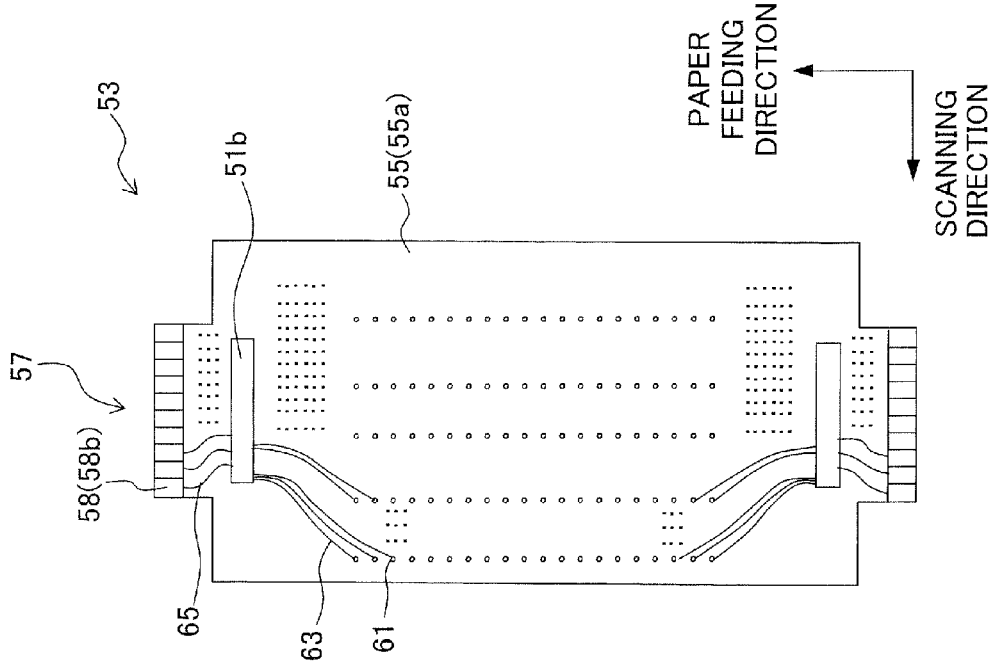
FIG. 6A is a plan view of a first FPC, observing two FPC from the under side.
Figure 6B:
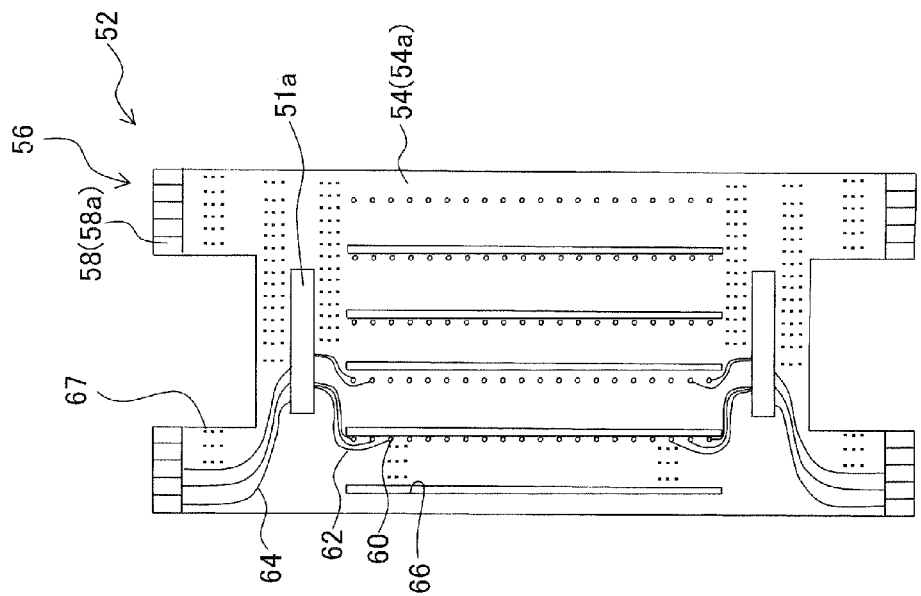
FIG. 6B is a plan view a second FPC, observing the two FPC from the under side.

Next, explanations will be made with respect to the FPC unit 50. In FIGS. 5, 6A, and 6B, a narrower interval is illustrated between the portion in which each FPC is joined with the actuator unit 31 and the portion in which each driver IC 51 is arranged. Further, FIG. 5 shows a signal supply portion 49a of the FFC 49 to be connected to a first input portion 56 and a second input portion 57 of a first FPC 52 and a second FPC 53 with a dashed-two dotted line. Further, FIG. 7B has omitted to show the wires.

As shown in FIG. 2, the central portion of the long FPC unit 50 in one direction (the paper feeding direction) is joined with the upper surface of the actuator unit 31 on which the plurality of individual electrodes 42 are arranged. Then, the two side portions of the FPC unit 50 sandwiching the joining portion of the FPC unit 50 which is joined to the actuator unit 31 are folded back upwardly, and an end portion of the FPC unit 50 is connected to the signal supply portion 49a (see FIG. 5) of the flexible flat cable 49 (FFC). Further, the driver ICs 51 are arranged respectively in the vicinity of the two end portions of the FPC unit 50. On the upper surfaces of these driver ICs 51, a heat sink 47 is arranged in contact with the driver ICs 51. Further, an end of the FFC 49 is connected to the control section 5.

The FPC unit 50 has the first FPC 52, and the second FPC 53 which is stacked on the first FPC 52. As shown in FIG. 6A, the first FPC 52 has a first substrate 54, two first input portions 56 which are located at both end portions of the first substrate 54 in the paper feeding direction, respectively, and each which includes a plurality of input terminals 58, first output contact points 62a which are formed on one surface 54a of the first substrate 54, first output bumps 60 which are connected integrally with the first output contact points 62a, two first driver ICs 51a (first driver ICs) which are arranged on the one surface 54a of the first substrate 54 at both sides of the portion in the paper feeding direction on which the first output bumps 60 are formed, first wires 62 which are formed on the one surface 54a of the first substrate 54 to connect the first output contact points 62a to the first driver ICs 51a, respectively, and second wires 64 which are formed on the one surface 54a of the first substrate 54 to connect the first driver ICs 51a to the first input portions 56, respectively. Further, through holes 66 are formed in the first substrate 54 to pass therethrough in a thickness direction. The first output bumps 60 are connected respectively to the input contact points 43a of the actuator unit 31. As a result, the first output contact points 62a are in electrical conduction with the input contact points 43a. Then, the first FPC 52 is arranged so that the one surface 54a of the first substrate 54 faces the upper surface of the piezoelectric layer 41 of the actuator unit 31.

Rectangular cutouts 67 are formed in the end portions of the first FPC 52 in the paper feeding direction at the center region of the end portions. In this manner, because the cutouts 67 are formed in the center region of the end portions of the first FPC 52 in the scanning direction, the first input portions 56 are arranged on both sides of the first substrate 54 in the scanning direction with an interval therebetween. That is, the first input portion 56 and the cutout 67 are arranged to be adjacent to each other in the scanning direction. Among the plurality of input terminals 58 of the first input portion 56, the input terminal 58a (first input terminal) located at an end adjacent to the cutout 67 is used for inputting a ground signal from the FFC 49 to the first driver IC 51a. The first output bumps 60 and the first output contact points 62a are aligned in the paper feeding direction with a predetermined interval, corresponding to the arrays of the input contact points 43a of the actuator unit 31. Five arrays of the first output bumps 60 and the first output contact points 62a are arranged, side by side, in the scanning direction.

The first driver ICs 51a supplies a drive signal to each of the individual electrodes 42. The drive signal supplied by the first driver ICs 51a is a pulse signal generated through switching between the power-supply potential and the ground potential and, the liquid drop jetted from the nozzles 35 varies in size (liquid drop diameter) and jet timing in accordance with the waveform of this pulse signal. Further, the timing of the leading edge/the trailing edge of the pulse signal potential is changed based on a waveform selection signal (input signal) inputted from the FFC 49 to the driver IC 51, which will be described hereinafter. By virtue of this, the drive signal is generated as a pulse signal. In this manner, the drive signal is supplied to the plurality of individual electrodes 42, respectively, in order to alter the size and jet timing of the liquid drop jetted from the nozzles 35. The two first driver ICs 51a are arranged on the first FPC 52 at both sides of the portion on which the first output bumps 60 are formed in the paper feeding direction. The two first driver ICs 51a are connected to the first output bumps 60 via the first wires 62 each of which is drawn between one of the arrays of the first output bumps 60 and one of the through holes 66 adjacent to the one of the arrays. Here, the first output bumps are divided into two regions by the center line of the first substrate 54 in the paper feeding direction of FIG. 6A.

The through holes 66 are formed to have a rectangular opening extending in the paper feeding direction, and arranged to align alternately with the arrays of the first output bumps 60 in the scanning direction. The through holes 66 are almost the same in the width in the scanning direction as second output bumps 61 which are formed on the second FPC 53 and will be described hereinafter.

As shown in FIG. 6B, the second FPC 53 has a second substrate 55, two second input portions 57 which includes a plurality of input terminals 58 formed on the both end portions of the second substrate 55 in the paper feeding direction, second output contact points 63a which are formed on one surface 55a of the second substrate 55, second output bumps 61 which are connected integrally with the second output contact points 63a, two second driver ICs 51b (second driver ICs) which are arranged on the one surface 55a of the second substrate 55 at both sides of the portion on which the second output bumps 61 are formed in the paper feeding direction, third wires 63 which are formed on the one surface 55a of the second substrate 55 to connect the second output contact points 63a to the second driver ICs 51b, and fourth wires 65 which are formed on the one surface 55a of the second substrate 55 to connect the second driver ICs 51b to the second input portions 57. The second output bumps 61 are connected to the input contact points 43b of the actuator unit 31. Accordingly, the second output contact points 63a are in electrical conduction with the input contact points 43b. Then, the second FPC 53 is arranged so that the one surface 55a of the second substrate 55 faces the other surface 54b of the first substrate 54 of the first FPC 52 (see FIG. 7A).

The second input portions 57 are formed in the end portions of the second FPC 53 in the paper feeding direction at the center region in the scanning direction so that the second input portions 57 overlap with the cutouts 67 of the first substrate 54 when the first FPC 52 and the second FPC 53 are superposed. Among the plurality of input terminals 58 of the second input portion 57, the input terminal 58b (second input terminal) at both ends in the scanning direction is used for inputting a ground signal from the FFC 49 to the second driver IC 51b. The second output bumps 61 are aligned at a predetermined interval in the paper feeding direction to correspond to the arrays of the input contact points 43b of the actuator unit 31. In this manner, five arrays of the second output bumps 61 are formed respectively. These arrays are aligned in the scanning direction. Further, the arrays of the second output bumps 61 are arranged to overlap the through holes 66 of the first substrate 54 when the first FPC 52 and the second FPC 53 are superposed.

The second driver ICs 51b are arranged at both sides of the portion of the second substrate 55, on which the second output bumps 61 are formed, in the paper feeding direction so that the second driver ICs 51b overlap with the cutouts 67 of the first substrate 54 when the first FPC 52 and the second FPC 53 are superposed. The two first driver ICs 51a are connected to the second output bumps 61 via the third wires 63 each of which is drawn between the arrays of the second output bumps 61. Here, the second output bumps 61 are divided into two regions by the center line of the second substrate 55 in the paper feeding direction of FIG. 6B.

Figure 7A:
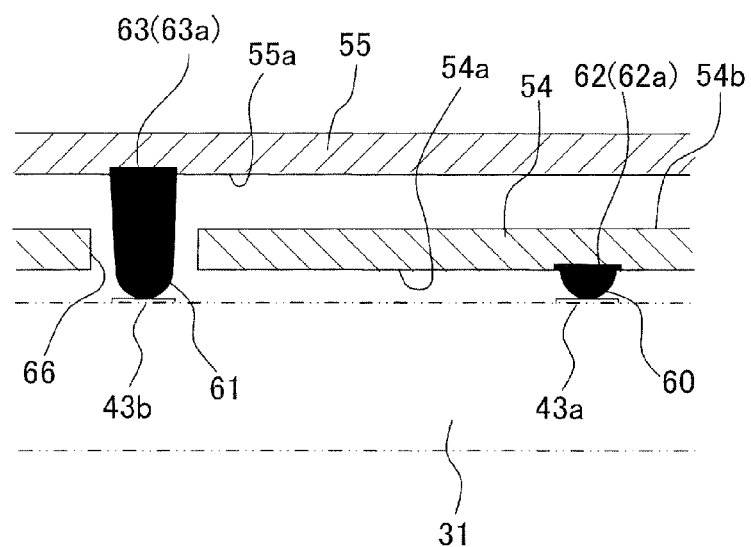
FIG. 7A is a longitudinal sectional view of the PFC unit taken along the line VIIA-VIIA of FIG. 5.

In the configuration of such first FPC 52 and second FPC 53, as shown in FIG. 5, when the one surface 55a of the second substrate 55 of the second FPC 53 is superposed or laid on the other surface 54b of the first substrate 54 of the first FPC 52 so that the one surface 55a of the second substrate 55 faces the other surface 54b of the first substrate 54, then the second output bumps 61 formed on the one surface 55a of the second substrate 55 are exposed from the through holes 66 formed in the first substrate 54 to the side of the one surface 54a of the first substrate 54. Then, as shown in FIG. 7A, the tips of the second output bumps 61 is arranged on almost the same plane with the tips of the first output bumps 60. In other words, the height positions of the tips of the second bumps 61 are substantially same as the height positions of the tips of the first bumps 60. In this manner, because the second output bumps 61 are exposed to the side of the one surface 54a of the first substrate 54 via the through holes 66, it becomes easy to connect the second output bumps 61 to the actuator unit 31. Further, because the tips of the first and second output bumps 60 and 61 are formed to become almost the same in the height from the one surface 54a of the first substrate 54, it becomes easy to connect the first and second output bumps 60 and 61 to the actuator unit 31.

Figure 7B:
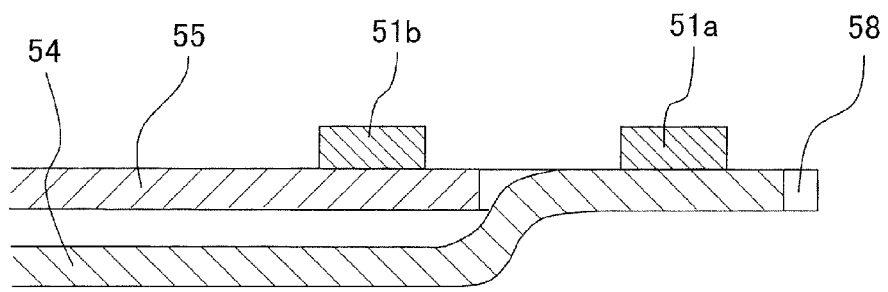
FIG. 7B is another longitudinal sectional view of the PFC unit taken along the line VIIB-VIIB of FIG. 5.

Further, as shown in FIGS. 5 and 7B, the second driver ICs 51b and the second input portions 57 of the second substrate 55 are exposed from the cutouts 67 formed in the first substrate 54 to the side of the one surface 54a of the first substrate 54. Then, the first input portion 56 formed at the first substrate 54 and the second input portion 57 formed at the second substrate 55 are arranged, side by side, on the same plane without intervals therebetween in the scanning direction. Accordingly, it is possible to regard the first input portion 56 and second input portion 57 as a single input portion for the signal supply portion 49a of the FFC 49. Further, the first driver ICs 51a, which are arranged on the first substrate 54, and the second driver ICs 51b, which are arranged on the second substrate 55, are aligned in the paper feeding direction.

Further, the first FPC 52 and the second FPC 53 are configured so that, when they are stacked each other, the convex portions of the first FPC 52 in which the input terminals 58 are formed overlap with the left and right portions of the second driver IC 51b of the second FPC 53. By virtue of this, at the time of stacking the first FPC 52 and the second FPC 53, it is possible to utilize the left and right portions as if as a margin to paste up. Therefore, a stabilized alignment or positioning is available between the first FPC 52 and the second FPC 53. Further, the second FPC 53 may also be configured so that the portions located at the side of the input terminals 58 overlap with the first FPC 52.

Next, explanations will be made with respect to the connection between the FPC unit 50 and the actuator unit 31. First, the one surface 54a of the first substrate 54 of the first FPC 52 is arranged to face the upper surface of the piezoelectric layer 41 of the actuator unit 31 so that the longitudinal direction of the FPC unit 50 becomes parallel to the paper feeding direction. Then, the first output bumps 60 formed on the one surface 54a of the first substrate 54 are aligned or positioned with the input contact points 43a of the odd-numbered arrays of the actuator unit 31 from the left of FIG. 3. At the same time, the second output bumps 61, which are formed on the one surface 55a of the second substrate 55 and which are exposed from the through holes 66 formed in the first substrate 54, are aligned with the input contact points 43b of the even-numbered arrays of the actuator unit 31 from the left of the FIG. 3. After the first and second substrates 54, 55 are positioned in such a manner, the first output bumps 60 are connected to the input contact points 43a, and the second output bumps 61 are connected to the input contact points 43b. Thereby, as shown in FIG. 2, the FPC unit 50 is connected to the upper surface of the piezoelectric layer 41 of the actuator unit 31. Then, the FPC unit 50 has a similar width to that of the actuator unit 31 in the scanning direction, and the portions of the FPC unit 50 on which the driver ICs 51 are arranged to be extended beyond the end portions of the actuator unit 31 in the paper feeding direction.

Then, in the FPC unit 50 connected to the actuator unit 31, one of the signal supply portions 49a of the FFC 49 is connected to the single input portion formed of the first input portion 56 and second input portion 57 which are aligned in an array in the scanning direction on the same plane. Then, the FPC unit 50 folds back upwardly, and the heat sink 47 is arranged to be in contact with the upper surfaces of the driver ICs 51 arranged on the upper sides of the first substrate 54 and the second substrate 55.

According to the FPC unit 50 in the embodiment, the wires from the first input portion 56 to be connected to the first output contact points 62a, and the wires from the second input portion 57 to be connected to the second output contact points 63a can be drawn, on two separate substrates, as the first wires 62 formed on the first substrate 54 and the third wires 63 formed on the second substrate 55, respectively. Therefore, the number of wires located on one substrate can be decreased, and thus it is possible to make it easy to draw the wires from the input portion to the output contact points. Further, because the first input portion 56 and the second input portion 57 are aligned in an array, they are connectable to one of the signal supply portions 49a of the FFC 49 as a single input portion. Therefore, it is possible to simplify the structure of the input portion, and thereby it is possible to expeditiously connect the signal supply portions 49a of the FFC 49 to the input portions, respectively.

Further, the second driver IC 51b is exposed from the cutout 67 formed in the first substrate 54 of the first FPC 52. Because the second driver IC 51b does not stand between the first substrate 54 and the second substrate 55, it is possible to narrow the interval between the first substrate 54 and the second substrate 55 in the stacking direction. For example, even when the driver IC 51 is arranged in the vicinity of the input portion of each of the FPCs, it is still possible to narrow the interval between the portion in the vicinity of the first input portion 56 of the first substrate 54 and the portion in the vicinity of the second input portions 57 of the second substrate 55 when the first substrate 54 is stacked on the second substrate 55. Therefore, it becomes easy to align the first input portion 56 and second input portions 57.

Further, the two input terminals 58a and 58b, which belong to the first input portion 56 and the second input portions 57, respectively and which are adjacent in the scanning direction, serve as ground input terminals for outputting a certain potential. Therefore, at the time of superposing the first substrate 54 and the second substrate 55, even when the two adjacent input terminals 58a and 58b are overlapped, no short circuit may occur to bring damage to the driver ICs or the power supply. Further, the second driver IC 51b is arranged on the second substrate 55 to be exposed from the cutout 67 formed in the first substrate 54. Therefore, the second driver IC 51b is arranged on substantially the same plane with the first driver IC 51a arranged on the first substrate 54, and thereby it is possible to cool the first driver IC 51a and the second driver IC 51b at the same time with the one heat sink 47 having a flat contact surface. Further, the first FPC 52 and the second FPC 53 may be connected to the actuator unit 31 after the first and second FPCs 52, 53 are stacked. In such cases, because the second output bumps 61 function as positioning members for the through holes 66 at the time of stacking the first FPC 52 and the second FPC 53, it is possible to superpose the first FPC 52 and the second FPC 53 in a simple manner.

Next, explanations will be made with respect to the modifications in which various changes are applied to the embodiment. However, those having the same structures as those of the above-described embodiment are denoted by the same reference numerals and symbols and explanation thereof will be omitted when appropriate.

<First Modification>

In the embodiment, the output bumps are formed separately on the first substrate 54 and the second substrate 55. Then, at the time of stacking the first substrate 54 and the second substrate 55, the second output bumps 61 are exposed from the through holes 66 formed in the first substrate 54 to the side of the one surface 54a of the first substrate 54 that is to be connected to the input contact points 43b formed on the piezoelectric layer 41. In this manner, the wires each of which ranges from the input portion to one of the output bumps are drawn separately on the first substrate 54 and on the second substrate 55. However, the present teaching is not limited to this configuration. For example, it is also possible to form all of the output bumps on the first substrate 54. In this case, it is possible to draw the wires each of which ranges from the input portion to one of the output bumps formed on the first substrate 54 separately on the first substrate 54 and on the second substrate 55. Hereinbelow, explanations will be made with respect to a specific example in reference to FIGS. 8A and 8B.

Figure 8A:
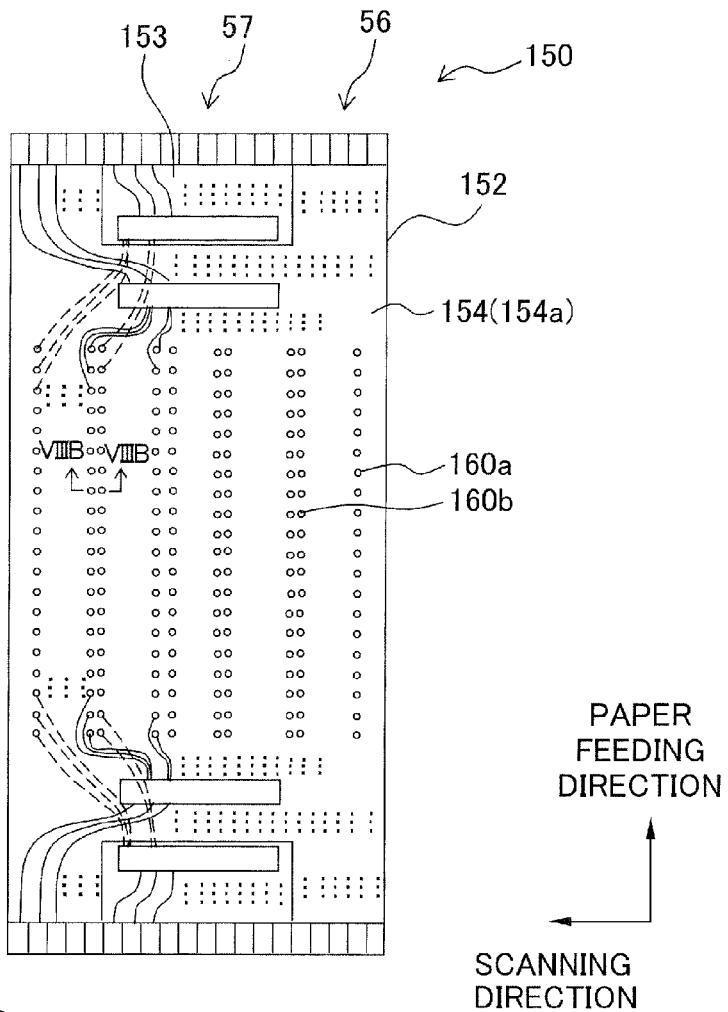
FIG. 8A is a plan view observing an FPC unit in accordance with a first modification from the under side for explaining the first modification.

As shown in FIG. 8A, on one surface 154a which belongs to a first substrate 154 of a first FPC 152 in an FPC unit 150 and which faces the actuator unit 31, all output bumps 160 are formed to be connected to the input contact points 43a and 43b of the actuator unit 31. Then, among the plurality of output bumps 160, the output bumps 160a included in the even-numbered arrays from the left of FIG. 8A correspond to the first output bumps 60 in the embodiment described hereinbefore and are connected to the first input portions 56 via the first driver ICs 51a, in the same manner as the first output bumps 60. Hereinbelow, explanations will be made with respect to the connection between the second input portion 57 and the output bumps 160b of the odd-numbered arrays from the left of the FIG. 8A among the plurality of the output bumps 160.

Figure 8B:
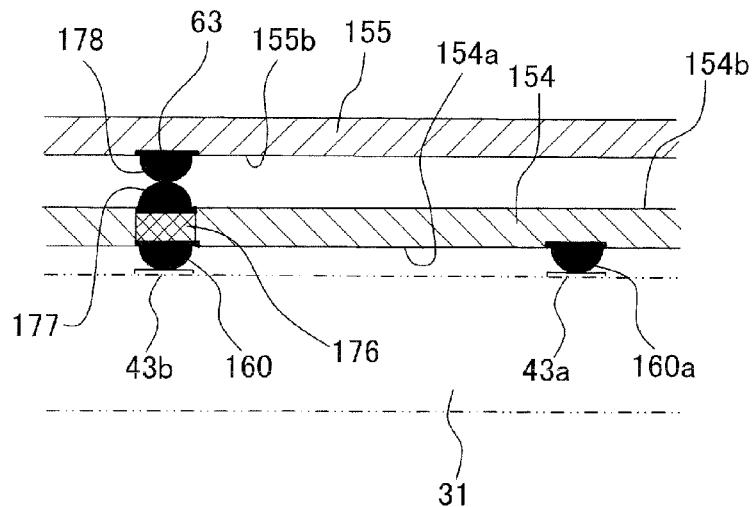
FIG. 8B is a cross-sectional view taken along the line VIIIB-VIIIB of FIG. 8A.

As shown in FIG. 8B, first connection bumps 177 are formed on the other surface 154b of the first substrate 154 to overlap the output bumps 160b in a plane view and are formed to be connected to these output bumps 160b via conductive through holes 176, respectively. Further, in this description, the conductive through hole refers to a through hole which is configured to electrically conduct two objects arranged on both sides of the through hole, such as through holes in which a conductive material is filled, or through holes in which a conductive material is applied to the inner surface of the through holes. Then, second connection bumps 178 are formed on one surface 155b of a second substrate 155 forming one part of a second FPC 153. At the time of stacking the first substrate 154 and the second substrate 155, the second connection bumps 178 overlap with the first connection bumps 177 in a plane view and, at the same time, the second connection bumps 178 are connected to first connection bumps 177, respectively. Then, the second connection bumps 178 are connected to the third wires 63, in the same manner as the second output bumps 61 in the embodiment described hereinbefore. With respect to the connection from the third wires 63 to the second input portion 57 via the second driver IC 51b, explanations will be omitted because it is similar to that of the embodiment described hereinbefore. By virtue of this, a similar effect is available to that of the embodiment described hereinbefore. Further, because all of the output bumps 160 connected to the actuator unit 31 are formed on the first substrate 154, it becomes easier to form the contact points with a uniform height in comparison with the case in which the second output bumps 61 that are a part of the output bumps are formed on the second substrate 55 as the embodiment described hereinbefore. Thereby, it is possible to facilitate reduction of poor connection to the input contact points 43a and 43b of the actuator unit 31.

<Second Modification>

Further, in the embodiment, the first driver IC 51a arranged on the first substrate 54 and the second driver IC 51b arranged on the second substrate 55 are arranged to align in the paper feeding direction. Further, the cutout 67 is formed in the end portion of first substrate 54 in the paper feeding direction at the center region thereof in the scanning direction in order to correspond to the arrangement of the driver ICs 51a, 51b.

Figure 9:
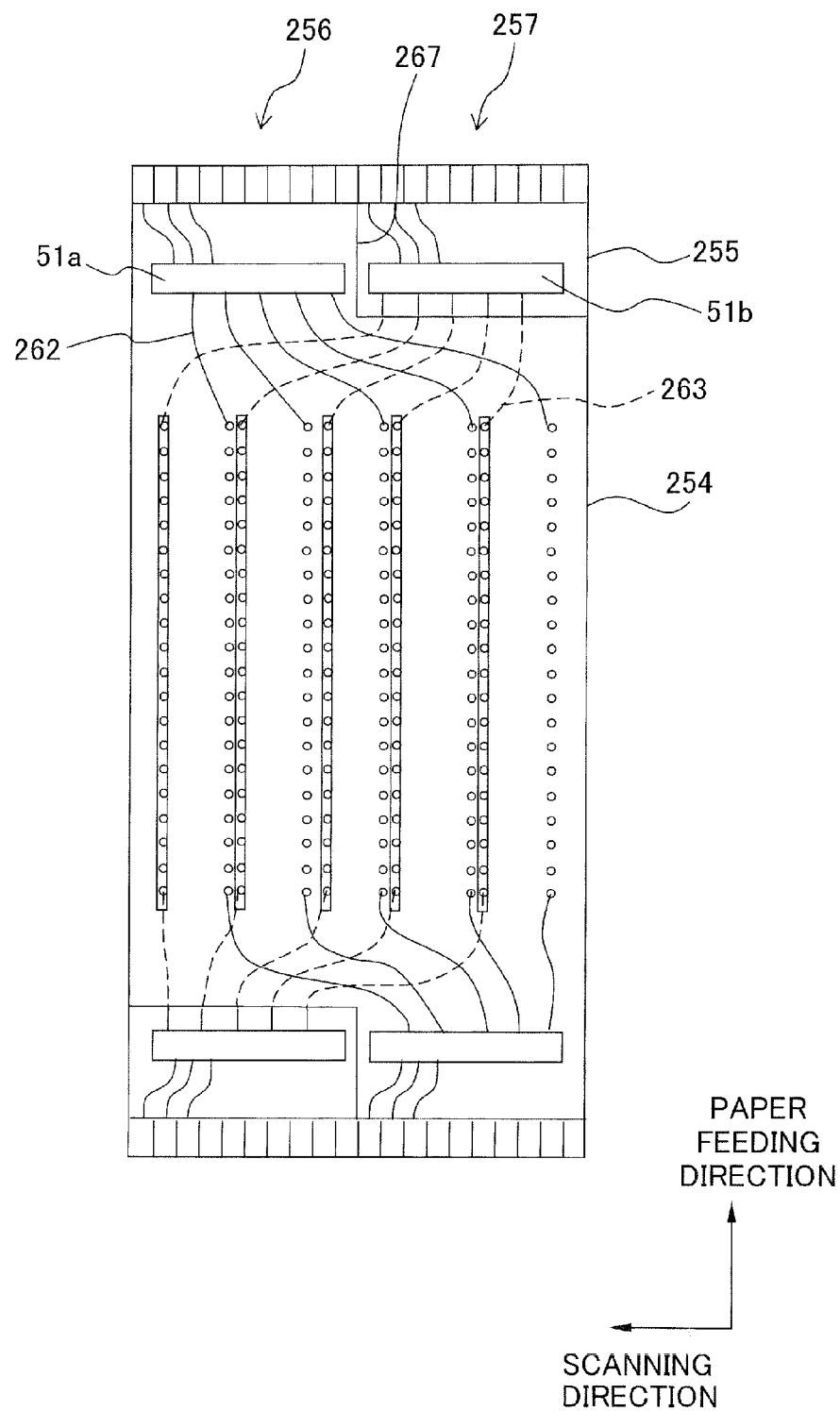
FIG. 9 is a plan view observing an FPC unit in accordance with a second modification from the under side.

However, the present teaching is not limited to this configuration. For example, as shown in FIG. 9, the first driver IC 51*a* arranged on a first substrate 254 and the second driver IC 51*b* arranged on a second substrate 255 may also be arranged to align in the scanning direction. At this time, a cutout 267 is formed aside in one scanning-direction side of each of the end portions of the first substrate 254 in the paper feeding direction so that the second driver IC 51*b* arranged on the second substrate 255 is exposed from the cutout 267. Further, a first input portion 256 formed at the first substrate 254 and a second input portion 257 formed at the second substrate 255 are also aligned in an array in the scanning direction, in the same manner as the first driver IC 51*a* and the second driver IC 51*b*.

When electric currents flow through the wires formed on the first substrate 254 and the wires formed on the second substrate 255, magnetic fields are generated therearound. At the time, when the area of the first substrate 54 on which the first output bumps 60 are formed overlaps with the area of the second substrate 55 on which the second output bumps 61 are formed, in a plane view, and when the first driver IC 51*a* and the second driver IC 51*b* are aligned in the paper feeding direction as in the embodiment described hereinbefore, then there are many parallel portions along the paper feeding direction between the wires formed on the first substrate 54 and the wires formed on the second substrate 55. In those portions, crosstalk is more likely to occur. For example, crosstalk is more likely to occur in the parallel portions between the first wires 62 drawn from the first driver IC 51*a* to the first output bumps 60 on the first substrate 54 and the third wires 63 drawn from the second driver IC 51*b* to the second output bumps 61 on the second substrate 55. Here, when the first driver IC 51*a* and the second driver IC 51*b* are arranged to align in the scanning direction, then intersectional portions are increased between first wires 262 formed on the first substrate 254 and third wires 263 formed on the second substrate 255, and thus parallel portions can be decreased along the paper feeding direction. Therefore, it is possible to facilitate reduction of crosstalk. In the case of arranging the FPC unit to fold back as shown in FIG. 2, when the first driver ICs 51*a* and second driver ICs 51*b* become more in number, in comparison with the case of aligning them in the paper feeding direction, it is preferable to arrange the first driver ICs 51*a* and second driver ICs 51*b* to align in the scanning direction as shown in FIG. 9. In FIG. 2, if the plurality of first and second driver ICs are aligned in the paper feeding direction, the ink-jet head 3 gets larger in the paper feeding direction. On the contrary, if the plurality of first and second driver ICs are aligned in the scanning direction, although the ink-jet head 3 gets larger in the scanning direction, it is possible to restrain the ink-jet head 3 from getting larger in the paper feeding direction.

Further, the manner of drawing the wires for the reduction of crosstalk is not limited to that described hereinabove. For example, in the embodiment described hereinbefore, one side of the driver IC 51 in the paper feeding direction is utilized for connection to the input portion via wires, while the other side is utilized for connection to the output bumps via other wires. However, the output bumps may be formed on the one side and may be connected to the input portion by drawing the wires to be not parallel to other wires but intersect therewith.

Hereinbelow, explanations will be made with respect to various alterations applicable to the embodiment and its modifications. These alterations may also be applied in any combination as long as they do not contradict each other.

Further, in the embodiment, the explanations were made with respect to the case of stacking the first FPC 52 and the second FPC 53 into a two-layer unit. However, the number of the stacked layers may also be more than two. Further, in the case of stacking the first FPC 52 and the second FPC 53, the first input portion 56 and the second input portion 57 may not necessarily be aligned in a straight array but, for example, may be arranged in an L-shape as well.

Further, in the embodiment, the output bumps formed on the first substrate 54 and on the second substrate 55 are arranged to align in the paper feeding direction to form arrays, and the arrays are arranged to align in the scanning direction. However, the output bumps may also be arranged randomly without regularity.

Further, in the embodiment, among the plurality of output bump arrays, the odd-numbered arrays and the even-numbered arrays are formed on two different substrates. However, the plurality of output bumps may be formed on the two substrates in any divisional manner.

Further, in the embodiment, the through holes 66 are formed in the first substrate 54 to correspond to the arrays of the second output bumps 61. However, the through holes 66 may also be formed to correspond to the second output bumps 61.

Further, in the embodiment, the first input portion 56 and the second input portion 57 are aligned at an interval which is the same as the interval between the two input terminals belonging to the same input portion. However, the interval between the first input portion 56 and the second input portions 57 may have a longer interval than the interval between the two input terminals as long as the first and second input portions are aligned in an array.

Further, in the embodiment, the cutouts 67 are formed in the first substrate 54 to expose the second input portions 57 of the second substrate 55. However, cutouts may also be formed in the second substrate 55 to expose the first input portions 56 of the first substrate 54. In the embodiment, the input terminals 58 of the first input portion 56 are arranged on the one surface 54*a* of the first substrate 54, which is opposite to the second substrate 55, and the input terminals 58 of the second input portion 57 are arranged on the one surface 55*a* of the second substrate 55, which faces the first substrate 54. However, the present teaching is not limited to this configuration. For example, the input terminals 58 of the first input portion 56 may be arranged on the other surface 54*b* of the first substrate 54, and the input terminals 58 of the second input portion 57 may be arranged on the other surface 55*b* of the second substrate 55. The input terminals 58 of the first input portion 56 may be arranged on the one surface 54*a* of the first substrate 54, and the input terminals 58 of the second input portion 57 may be arranged on the other surface 55*b* of the second substrate 55. Or, the input terminals 58 of the first input portion 56 may be arranged on the other surface 54*b* of the first substrate 54, and the input terminals 58 of the second input portion 57 may be arranged on the one surface 55*a* of the second substrate 55.

Further, in the embodiment, the two input terminals 58*a* and 58*b*, which belong respectively to the first input portion 56 and the second input portions 57 that are different from each other and that are adjacent in the scanning direction, serve as ground input terminals. However, the two input terminals 58*a* and 58*b* may also be terminals for inputting the power-supply potential to the driver IC 51. In this case, because the two input terminals 58*a* and 58*b*, which belong respectively to the first input portion 56 and the second input portions 57 that are different from each other and that are adjacent in the scanning direction, serve as power-supply input terminals which output a certain potential, at the time of stacking the first substrate 54 and the second substrate 55, even if the two adjacent input terminals 58a and 58b are overlapped to cause a short circuit, no problem may occur.

Figure 10:
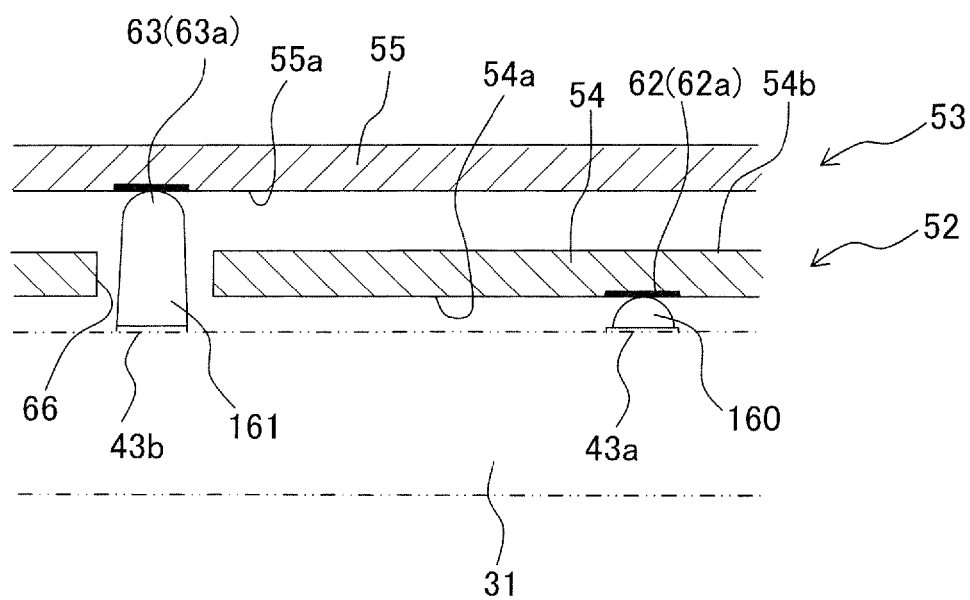
FIG. 10 is a longitudinal sectional view of an FPC unit connected to an actuator unit in accordance with an alteration of the embodiment.

Further, in the embodiment, the first output bump 60 is formed integrally on the first output contact point 62a of the first substrate 54, while the second output bump 61 is formed integrally on the second output contact point 63a of the second substrate 55. However, as shown in FIG. 10, a first output bump 160 may also be formed on the input contact point 43a of the actuator unit 31, while a second output bump 161 may also be formed on the input contact point 43b of the actuator unit 31.

The embodiment and its modifications described hereinabove apply the present teaching to an FPC unit for driving the actuator of an ink-jet head. However, the object of applying the present teaching is not limited to such an FPC unit. It is possible to apply the present teaching to all FPC units which carry out a power feeding to the apparatus for any purposes, such as those for connecting the inner substrates of an electric device such as a PC and the like.

What is claimed is:

1. A wiring substrate unit which is connected to a signal supply portion and through which a signal is transmitted to a drive object, comprising:
   a first wiring substrate through which the signal is transmitted to the drive object;
   a second wiring substrate which is stacked on the first wiring substrate and through which the signal is transmitted to the drive object;
   a first input portion which includes a plurality of first input terminals formed in an end portion of the first wiring substrate and which is connected to the signal supply portion;
   a second input portion which includes a plurality of second input terminals formed in an end portion of the second wiring substrate and which is connected to the signal supply portion;
   a plurality of first output contact points which is formed on one surface of the first wiring substrate and which is electrically connected to the first input portion; and
   a plurality of second output contact points which is formed on one surface of the second wiring substrate and which is electrically connected to the second input portion;
   wherein the first wiring substrate and the second wiring substrate are stacked so that the other surface of the first wiring substrate faces the one surface of the second wiring substrate;
   wherein a through hole, which is configured to electrically conduct the second wiring substrate and the drive object, is formed in the first wiring substrate to correspond to the second output contact points formed on the second wiring substrate;
   wherein a cutout is formed at a position adjacent to the first input portion of the end portion of the first wiring substrate or at a position adjacent to the second input portion of the end portion of the second wiring substrate;
   wherein one of the first input portion of the first wiring substrate and the second input portion of the second wiring substrate is exposed from the cutout;
   wherein the wiring substrate unit further comprises a driver IC which is installed on one of the first and second wiring substrates;
   wherein the cutout is formed on the other of the first and second wiring substrates; and
   wherein the driver IC is arranged at an end portion of the one of the first and second wiring substrate so that the driver IC is exposed from the cutout.

2. The wiring substrate unit according to claim 1;
   wherein the first input portion and the second input portion are aligned in an array.

3. The wiring substrate unit according to claim 2, further comprising:
   a plurality of first output bumps which is formed integrally with the first output contact points; and
   a plurality of second output bumps which is formed integrally with the second output contact points.

4. The wiring substrate unit according to claim 3;
   wherein the second output bumps are exposed from the one surface of the first wiring substrate via the through hole.

5. The wiring substrate unit according to claim 4;
   wherein a height of the second output bumps from the one surface of the first wiring substrate is substantially the same as a height of the first output bumps from the one surface of the first wiring substrate.

6. The wiring substrate unit according to claim 2;
   wherein the driver IC includes a first driver IC and a second driver IC;
   wherein the first driver IC is installed on the one surface of the first wiring substrate to receive an input signal inputted from the first input portion and supply a drive signal to the drive object;
   wherein the cutout is formed at the position adjacent to the first input portion of the end portion of the first wiring substrate; and
   wherein the second driver IC is installed on the area of the one surface of the second wiring substrate exposed from the cutout formed in the first wiring substrate to receive another input signal inputted from the second input portion and supply another drive signal to the drive object.

7. The wiring substrate unit according to claim 6;
   wherein both of one of the first input terminals which is located at an end position in the first input terminals and one of the second input terminals which is located at an end position in the second input terminals and is adjacent to the one of the first input terminals are power-supply input terminals to which a power-supply voltage is inputted or ground input terminals to which a ground potential is inputted.

8. The wiring substrate unit according to claim 6;
   wherein the first driver IC and the second driver IC are arranged at an area adjacent to areas, in one direction, in which the first output contact points and the second output contact points are arranged; and
   wherein the first and second driver ICs are aligned in a direction perpendicular to the one direction.

9. The wiring substrate unit according to claim 6;
   wherein the first driver IC includes a plurality of first driver ICs installed on both end portions of the first wiring substrate in the longitudinal direction; and
   wherein the second driver IC includes a plurality of second driver ICs installed on both end portions of the second wiring substrate in the longitudinal direction.

10. The wiring substrate unit according to claim 2;
    wherein a conductive material is arranged in the through hole;
    wherein the first output contact points are connected to the drive object, and the signal inputted from the first input portion and the second input portion is supplied to the drive object via the first output contact points;
    wherein a plurality of first connection contact points is formed on the other surface of the first wiring substrate to overlap a part of the first output contact points in a plane view and is formed to be electrically connected to the first output contact points via the conductive material arranged in the through hole; and wherein the second output contact points are formed as the second connection contact points connected to the first connection contact points.

11. The wiring substrate unit according to claim 1;

wherein the first output contact points are arranged to form a plurality of first output contact point arrays each of which extends in a longitudinal direction of the first wiring substrate;

wherein the second output contact points are arranged to form a plurality of second output contact point arrays each of which extends in the longitudinal direction;

wherein the through hole is formed as a plurality of long through holes each of which extends in the longitudinal direction; and wherein the long through holes are arranged to be adjacent to the first output contact point arrays and are formed to expose all of the second output contact points included in one of the second output contact point arrays.

12. The wiring substrate unit according to claim 1;

wherein the first input terminals are arranged on the one surface of the first wiring substrate, and the second input terminals are arranged on the one surface of the second wiring substrate.

13. A printer which discharges an ink to a medium to form an image, comprising:

a transport mechanism which transports the medium;

a head which discharges the ink to the medium transported by the transport mechanism; and a control section which controls the head;

wherein the head has:

a channel unit in which a nozzle and a channel are formed;

an actuator which applies a discharge pressure to the ink in the channel unit; and the wiring substrate unit, as defined in claim 1, which electrically connects the actuator and the control portion.

\* \* \* \* \*